United States Patent [19]

Teza

[11] 4,340,871
[45] Jul. 20, 1982

[54] LOW POWER OSCILLATOR HAVING CLAMPING TRANSISTORS ACROSS ITS TIMING CAPACITORS

[75] Inventor: Jeffrey R. Teza, Houston, Tex.

[73] Assignee: Texas Instruments Incorporated, Dallas, Tex.

[21] Appl. No.: 75,567

[22] Filed: Sep. 14, 1979

[51] Int. Cl.³ .............................................. H03K 3/354
[52] U.S. Cl. .................. 331/111; 331/113 R
[58] Field of Search ................. 331/111, 113 R, 143, 331/144, 108 C, 108 D, DIG. 3, 57

[56] References Cited

U.S. PATENT DOCUMENTS 3,708,757 1/1973 Savarese et al. ............ 331/108 D X
3,955,355 5/1976 Luce ..................................... 364/705
4,066,982 1/1978 Strohl .................................. 331/111

FOREIGN PATENT DOCUMENTS 440772 2/1975 U.S.S.R. ........................... 331/113 R

Primary Examiner—Siegfried H. Grimm
Attorney, Agent, or Firm—Robert D. Marshall; Melvin Sharp; Leo N. Heiting

[57] ABSTRACT

A method and apparatus for producing near constant duty cycle over a wide range operating voltage by connecting clamping transistors across critical timing capacitors so as to eliminate undesirable charge injection in MOS and CMOS oscillator systems. In an oscillator in which two inverters are cross-coupled through timing capacitors, each timing capacitor is shunted by a clamping transistor controlled by the output from one of the inverters. The oscillator may be used in a handheld calculator.

8 Claims, 7 Drawing Figures

LOW POWER OSCILLATOR HAVING CLAMPING TRANSISTORS ACROSS ITS TIMING CAPACITORS

BACKGROUND OF THE INVENTION

This invention relates to oscillating systems, semiconductor integrated circuits, and electronic calculators, and particularly to a method and apparatus which produces near constant duty cycle and frequency over variations of semiconductor fabrication process parameters and operating conditions, and provides for low power consumption.

Integrated circuit oscillators commonly have non-ideal output waveforms requiring power consuming wave-shaping circuits to achieve output squarewaves with fast rise/fall transition times (less than 50 ns). Additionally, it has been difficult to achieve a 50% duty cycle with most designs.

SUMMARY OF THE INVENTION

Through simulation of metal oxide semiconductor (MOS) and complementary metal oxide semiconductor (CMOS) technology, standard astable multivibrator oscillator systems, it has been found that charge injection into tanks or the substrate of the semiconductor occur during oscillation, with the severity varying with operating conditions, thereby causing anomalies in other circuitry on the chip. Charge injection may be eliminated in accord with the present invention, by connecting transistors across the critical timing capacitors, where each transistor is physically sized for speed to clamp the voltage across the timing capacitor to a value less than that which could cause the undesired charge injection. Additionally, electrical (circuit, device sizing and ratio, etc.) and geometric (either mirror image or uniform stepping direction for each half of the bar layout) symmetry is maintained between the stages of the oscillator system so as to maintain a stable duty cycle over fabrication process and operating condition variations. Additionally, the output of the oscillator system yields a push-pull square wave output capable of driving a low impedance load directly without buffering. In a preferred CMOS embodiment, the oscillator system exhibits low power consumption when driving a capacitive load, the power consumption composed primarily of current transients occuring during switching.

BRIEF DESCRIPTION OF THE DRAWINGS

Novel features believed to be characteristic of this invention are set forth in the appended claims. The invention itself, however, as well as other objects and advantages thereof may best be understood when read in conjunction with the following detailed description of illustrated embodiments by reference to the accompanying drawings in which:

DETAILED DESCRIPTION OF THE INVENTION

Figure 1:
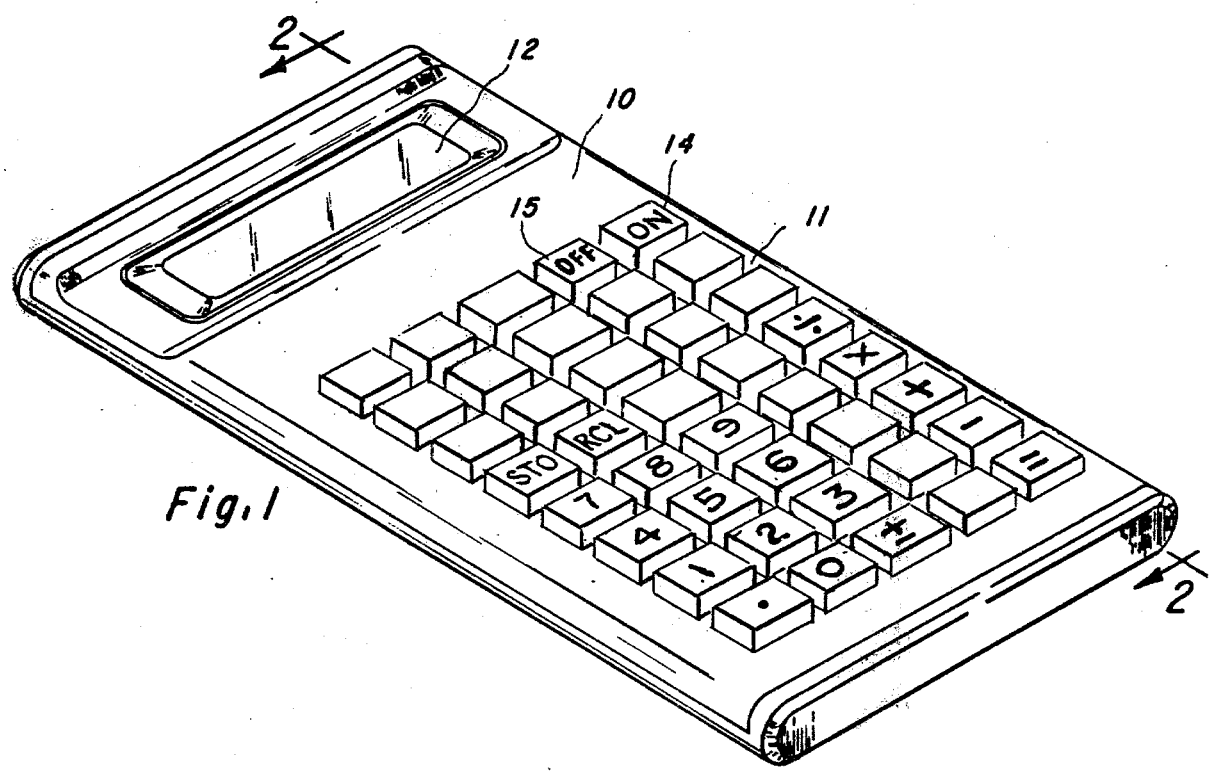
FIG. 1 is a pictoral view of a electronic calculator in which oscillator systems embodying the invention may advantageously by utilized.

Referring to FIG. 1, a typical handheld electronic calculator which incorporates the invention is shown. The calculator comprises a case or housing 10 of molded plastic or the like, with a keyboard 11 and a display 12. The keyboard includes number keys 0-9, a decimal point key, and several standard operation keys such as +, −, =, ×, :, etc. In some embodiments, the calculator system could perform a variety of additional functions, so keys such as $\sqrt{x}$, $$\sqrt[y]{x},$$

$Y^x$, SIN, COS, TAN, LOG, %, LN, STO, RCL, etc., may be included in the keyboard 11. Additional watch function and corresponding keys may be added. The display 12 has a number of digits of seven or more segment type, with decimal points. Displays of 8, 10 or 12 digits are commonly used and these may also include exponents for scientific notation, and minus sign for both mantissa and exponent. The display usually comprises liquid crystal devices (LCD), although visible light emitting diodes, vacuum fluorescent displays, or a gas discharge panel, for example, may also be used with appropriate interface circuitry. The calculator is a self-contained unit having a power supply in the form of a battery within the housing 10, although an AC adapter may be attached, as well as a battery charger if rechargeable nickel cadmium batteries are used.

In place of the usual ON-OFF slide switch which has been used in prior calculators, the calculator of FIG. 1 includes a push-button, momentary contact on switch 14 and a like push-button OFF switch 15. The switches 14 and 15 are exactly like the remainder of the keyswitches in the keyboard 11 in that they are single-pole single-throw normally open "Form A" switches which remain closed only as long as pressure is manually applied. In contrast, the usual slide switch would remain closed when moved to the ON position, supplying voltage from the battery to the electronic circuitry of the calculator continuously until the switch is manually moved to the OFF position.

Figure 2:
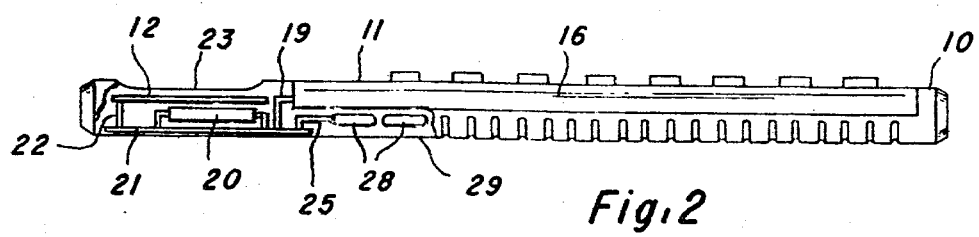
FIG. 2 is an elevational view in section of the calculator of FIG. 1 taken along the line 2—2 of FIG. 1.

In FIG. 2, the general form of the internal structure of the calculator is seen. The keyboard 11 includes an X-Y matrix keyboard device 16 suitably of the type shown in U.S. Pat. No. 4,005,293 issued Jan. 25, 1977, assigned to Texas Instruments Incorporated. About ten to thirteen rigid wires 19 extend from the end of the keyboard device 16 for connection to the electronic circuitry of the calculator. An integrated circuit calculator chip 20 contains all of the memory, arithmetic and control circuitry, and an oscillator for providing clock pulses for controlling the operations performed by the integrated circuit 20 and the display 12, as will be described. The chip 20 is encased in a standard twenty-eight pin dual-in-line plastic package for example, which is commonly used in the semiconductor industry.

Depending upon the complexity of the calculator, and the multiplexing scheme used, the number of pins in the package could be more or less, and also other chip packaging and mounting techniques may be used. The chip 20 is connected to a printed or etched circuit board 21 by soldering the pins to conductors on the board, as are the wires 19. The display 12 is mounted on a small PC board 22, beneath a plastic lens 423 which enhances the visibility of the display. The PC board 22 is mounted on the board 21 by pins soldered to conductors on the board which make the desired connections from the chip 20 to the display. A pair of silver oxide or equivalent batteries 38 are mounted in a compartment behind a door 29 in the housing 10, and is connected to the PC board 21 by wires 25 which are soldered to the PC board at one end and engage terminals of the battery by connectors at the other end.

The simplicity of the calculator is apparent from FIG. 2. It consists of a housing, a keyboard device, a chip, a display device, two small PC boards, and a battery. No components are needed on the board 21 except the chip 20, i.e., no resistors, capacitors, transistors, drivers, or any other devices.

Figure 3:
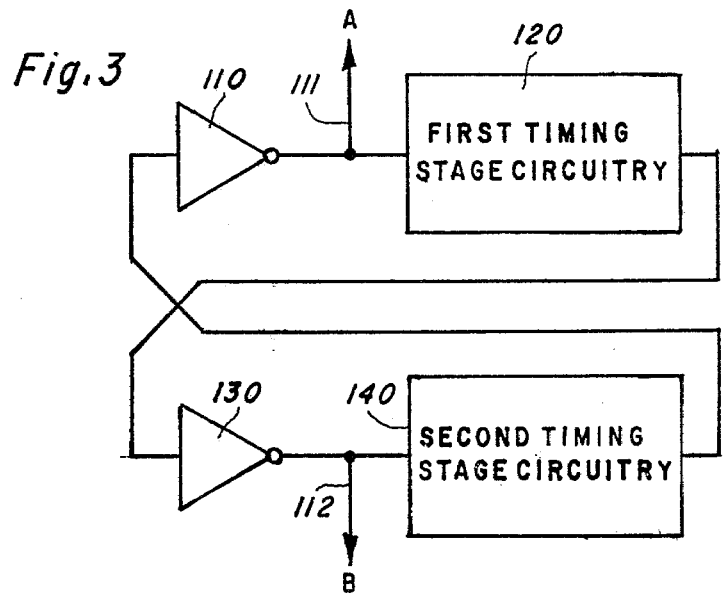
FIG. 3 is a block diagram of an oscillator system embodying the invention.

Referring to FIG. 3, a block diagram of an oscillator system embodying the invention is shown. The system is comprised of a first inverter 110, a first timing delay network stage 120, a second inverter 130, and a second timing delay network stage 140. An output of the inverter 110 is connected to a node 111 and to an input of the first timing stage 120. The first timing stage 120 is connected to an input of the inverter 130. The first timing stage 120 inserts a predetermined time delay between the state transition of the signal occurring at the output node 111 and the responsive state transition at the output of the first timing stage 120. An output of the inverter 130 is connected to a node 112 and to an input of the second timing stage 140, and an output of the second timing stage 140 is connected to an input of the first inverter 110. The second timing stage 140 inserts a predetermined time delay between the state transition of the signal occurring at the output node 112 and the responsive state transition at the output of the second timing stage 140. The output, signal, A, of the inverter 110, at node 111, is complementary to the output signal, B, of the inverter 130, at node 112. The first timing stage 120 and second timing stage 140 determine the on (first voltage level) times for the output B at the node 112 and the output A at the node 111, respectively.

Figure 4:
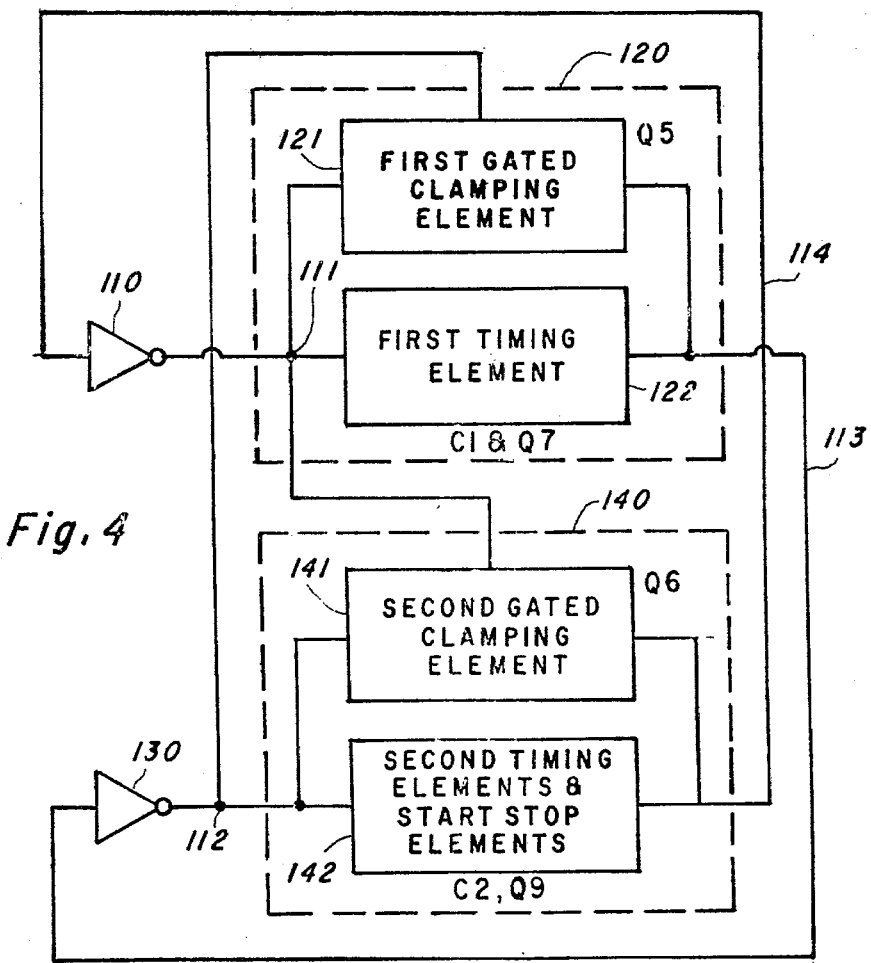
FIG. 4 is a detailed block diagram of the system of FIG. 3.

Referring to FIG. 4, the first timing stage 120 includes two discrete elements, a first gated clamping element 121 and a first delay network timing element 122. Similarly, within the second timing stage 140 are two discrete elements, a second gated clamping element 141 and a second delay network timing element 142. A transition low (second) to high (first) voltage level transition (to $V_{dd}$ in a preferred embodiment) at the node 111 activates the first timing element 122 to discharge the voltage at the input to the second inverter 130, at the node 113. As the voltage at the node 113 drops below a first threshold voltage, the inverter 130 is enabled, thereby changing states, outputting the high level voltage at the node 112. A similar cycle is repeated for the nodes 112 and 114 as the voltage as the node 114 begins to discharge responsive to the output of the second timing stage 140. As the voltage at the node 114 drops below the first threshold voltage, the inverter 110 is enabled and changes state. The output of the inverter 110 thereby causes the voltage at the node 111 to be forced to the high level.

When the voltage at the node 112 is driven to the high level by the inverter 130, the second gated clamping element 141 is disabled so as not to connect the node 112 to the node 114. The second timing element 142 gradually discharges the voltage at the node 114 at a discharge rate proportional to the time constant derived from the second timing element 142.

The high level voltage signal at the node 114 causes the output of the inverter 110 to go to the low level voltage signal at the node 111, the first timing element 122 coupling the stage transition at the node 111 to the node 113 thereby causing the node 113 to go to the low voltage level. Since the node 113 has already been discharged to the low voltage signal level, the coupled stage change of the inverter 110 would, absent the first clamping element 121, cause the voltage at the node 113 to go more negative than the negative voltage supply rail. However, the first clamping element 121 is shunt connected across the first timing element 122 so as to connect the voltage at node 111 to the node 113 when the element 121 is enabled. Clamping the node 113 to the node 111 prevents the voltage signal level at the node 113 from going more negative than the negative supply voltage rail (ground), thereby preventing charge injection problems. In an identical manner, the second gated clamping element 141, when enabled, and the second timing element 142 operate so as to shunt the voltage appearing at the node 114 to the node 112 to prevent charge injection problems. The second timing element 142 further comprises circuit means to start and stop the oscillation of the overall system, and, in a preferred embodiment, a single control signal input selects and actuates the start or stop state of the system. Thus, the clamping elements 121 and 141 connect the nodes 113 and 114, respectively, to the nodes 111 and 112, respectively, thereby effectively holding up the voltage at the nodes 113 and 114, respectively, to prevent charge injection. Each of the clamping elements 121 and 141 performs its required functions during a respective mutually exclusive half cycle of each whole cycle of the oscillator system.

Figure 5:
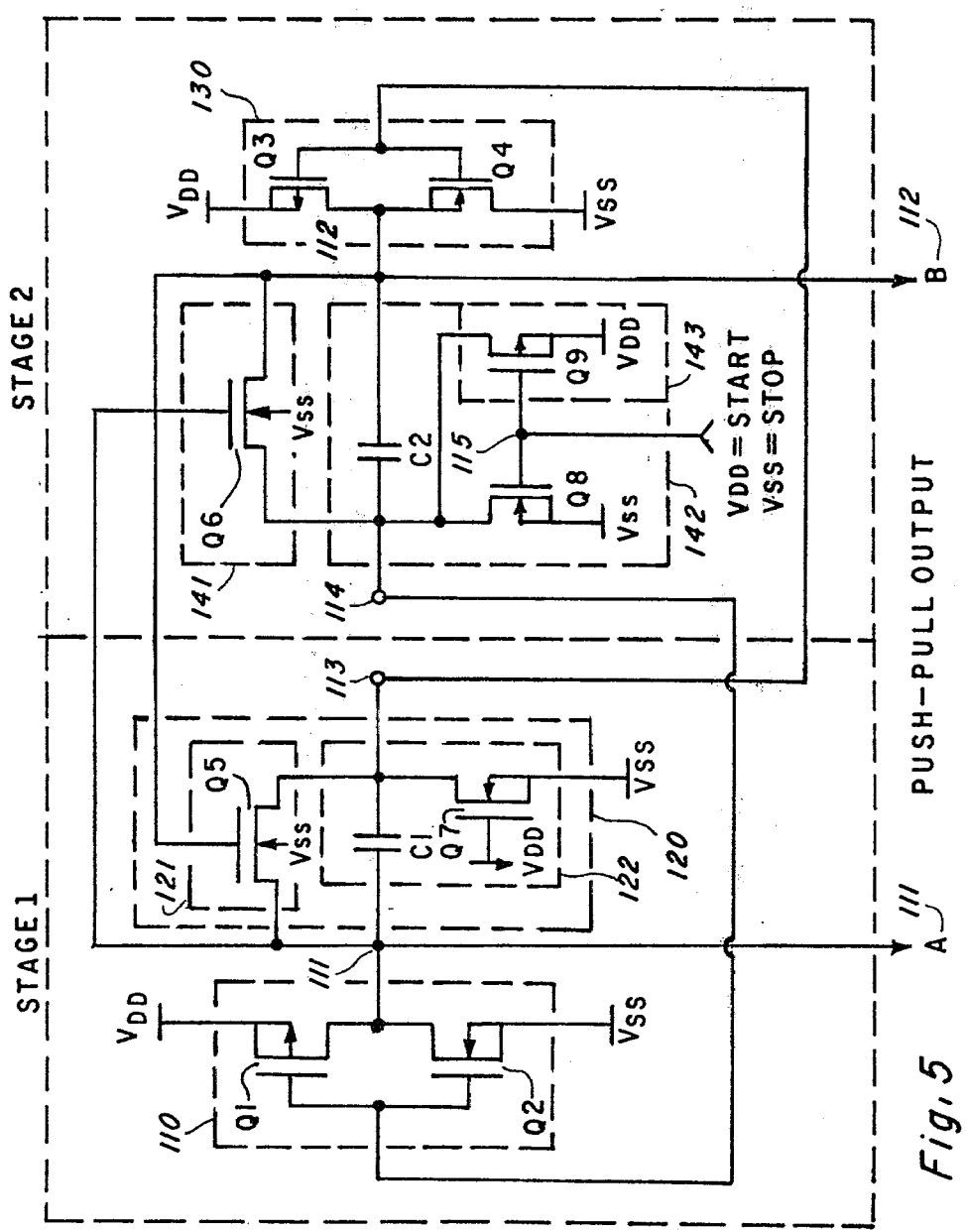
FIG. 5 is a detailed schematic circuit of the oscillator system as shown in FIGS. 3 and 4.

Referring to FIG. 5, a detailed schematic of the oscillator system of FIGS. 3 and 4 is shown in a CMOS embodiment. The corresponding circuit functions are represented by corresponding reference numbers. The inverter 110 is comprised of a P-channel enhancement mode MOS transistor in series connection with an N-channel enhancement mode transistor Q2, configured as an inverter with commoned inputs. The output of the inverter 110 is connected to the node 111, which is also connected to the first clamping means 121 and the first timing element 122. First clamping element 121 is comprised of an N-channel enhancement mode MOS transistor Q5 the drain of which is connected to the node 111 and the source of which is connected to the node 113. The gate of transistor Q5 is connected to the node 112. The first timing element 122 is comprised of a capacitor and a discharge transistor Q7 configured as a current sink. The capacitor C1 is connected between the nodes 111 and 113. The transistor Q5 of the first gated clamping means 121 is connected in shunt across the capacitor C1. The gate of transistor Q7 is connected to the positive voltage supply $V_{dd}$, while the source and substrate of the transistor Q7 are connected to the negative supply voltage Vss. The drain of transistor Q7 is connected to the node 113 such that the transistor Q7 discharges the capacitor C1, thereby lowering the voltage at node 113, when the clamping transistor Q5 is disabled. The input of the inverter 130 is connected to the node 113.

The second inverter 130 is comprised of a P-channel enhancement mode MOS transistor Q3 and an N-channel enhancement mode MOS transistor Q4 in series connection with commoned inputs so as to form a CMOS inverter stage. The output of the second inverter 130 is connected to the node 112, and therefrom to the second gated clamping element 141 and to the second timing element and stop/start elements 142. The second gated clamping element 141 is comprised of an N-channel enhancement mode MOS transistor Q6. The drain, source, and gate, of transistor Q6 are connected to the nodes 112, 114, and 111, respectively. The second timing element and start/stop elements 142 are comprised of a capacitor C2 connected between the nodes 112 and 114, a discharge transistor Q8, and a start/stop transistor Q9. The discharge transistor Q8 is an N-channel enhancement mode MOS transistor, with its source and substrate connected to the Vss supply, its drain connected to the node 114, and its gate connected to the start/stop control input node 115, responsive to an input excitation for start and stop control. The transistor Q9 is a P-channel enhancement mode MOS transistor, the gate of which is connected to the node 115 in common with the gate of N-channel transistor Q8, the source and substrate of which are connected to the $V_{dd}$ supply, and the drain of which is connected to the node 114. When the start/stop signal appearing at the node 115 is at the $V_{dd}$ signal level, the transistor Q9 is disabled, the transistor Q8 is enabled and the transistor Q8 and capacitor C2 form the second timing element of the second timing means 142 so as to perform an identical function as that performed by the first timing means 122. Alternatively, when the voltage supply at node 115 is at the Vss voltage supply level, the transistor Q8 is disabled, and the transistor Q9 is enabled so as to connect the node 114 to the Vdd supply voltage rail, which thereby effectively stops oscillation by inhibiting transitions at the node 114. The clamping transistor Q6 of clamping element 141 is shunt connected across the capacitor C2 of the second timing and start/stop elements 142, so as to effectively clamp and connect the voltage at the node 114 to the node 112 when the voltage at the node 111 is positive, thereby preventing the voltage at the node 114 from going more negative than the negative supply Vss, and preventing charge injection problems.

The clamping transistor Q5 of the first gated clamping element 121 in conjunction with the capacitor C1 performs in an identical manner as does transistor Q6 in conjunction with the capacitor C2 of the second timing element 141. When the voltage at node 112 is at a high level (Vdd), transistor Q5 is enabled, thereby connecting the node 113 to the node 111, and preventing the voltage at the node 113 from going more negative than the negative supply voltage Vss.

Figure 6:
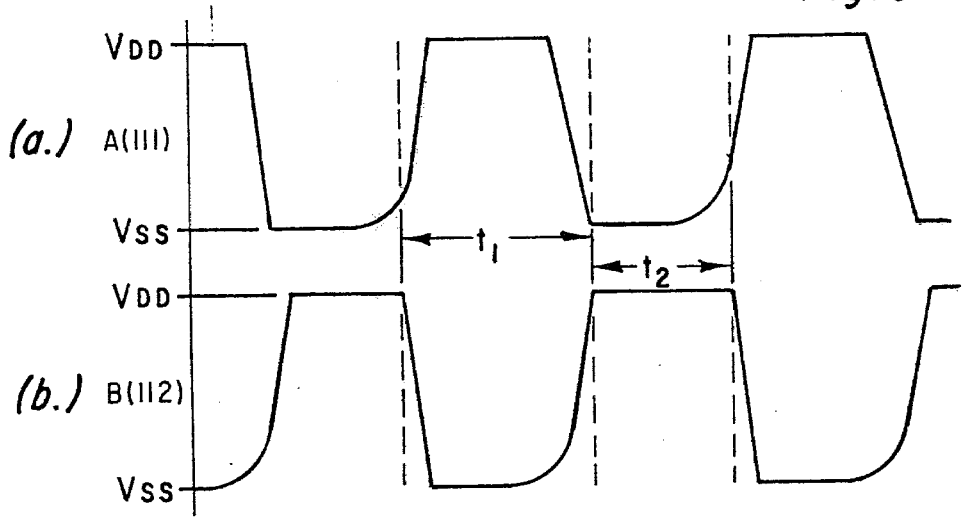
FIGS. 6a and 6b are graphical representations of voltages appearing at the push/pull output nodes A and B of FIG. 4, respectively, plotted as a function of time for the oscillator system on-state.

The operation of the circuits of FIGS. 3, 4 and 5 may be better understood by reference to the voltage timing waveforms of FIG. 6. The voltage waveforms at the output nodes A, 111, and B, 112 of FIGS. 3, 4 and 5, are plotted as a function of time for the oscillator system with the start/stop signal at a Vdd voltage level thereby enabling the oscillator system to an on-state. Referring to FIG. 6a the output signal from the inverter 110 appearing at node 111 is shown. The signal A is a periodic square wave signal oscillating between the Vdd and the Vss voltage supply levels. In the preferred embodiment as shown in FIG. 5, the output signals A and B are low inpedance drive, source signals, and, depending upon the size (which is directly proportional to transition speed) of the transistors in the inverters 110 and 130, may be large enough to drive an external load directly. The on-time of the output A, that is the time during which the output A is at the Vdd signal level, is derived from the RC time constant formed by the capacitor C1 and transistor Q7 of the first timing element 122 as shown in FIG. 5. The on-time, $t_1$, of output A corresponds to an off-time (Vss level output) of the output B as shown in FIG. 6b. The off-time of the output A, corresponding to the on-time $t_2$ of output B of FIG. 6b, is determined by an RC time constant derived from capacitor C2 and transistor Q8 of the second timing element 142. The output waveform B, of FIG. 6b, is the inverse and complementary signal waveform to that of the output A as shown in FIG. 6a.

Two factors principally contribute to the oscillator output signal symmetry. Firstly, the ratio of the N-channel discharge transistors Q7 and Q8 and timing capacitors C1 and C2 are made identical for each half of the oscillator by bar layout and circuit symmetry. Secondly, the clamp transistors Q5 and Q6 provide for a consistent initial voltage at the start of each charge cycle, and prevent undershoot and current injection, allowing for repeatable symmetrical clock signal generation.

Referring again to FIG. 5, the capacitor C1 and transistor Q7 of the first timing element 122 form an RC time constant network. When the voltage at the node 111 is switched to Vdd, the voltage at the node 113 is coupled to the Vdd voltage by capacitor C1. As transistor Q5 of the first clamping means 121 is disabled, the transistor Q7 begins to drain charge from the node 113 and capacitor C1 until the output at node 113 reaches the trip voltage threshold of the inverter 130, thereby forcing the voltage at node 112 to go to a high level and enabling clamp transistor Q5, thereby shunting nodes 111 and 113. The clamping transistors Q5 and Q6 are sized according to the desired switching speed and capacitor sizes. The channel resistance of the transistor Q7 along with the capacitance of capacitor C1 form the basis of the RC time constant $t_1$.

The sequence of operations will be described through a complete clock cycle. First, assuming the voltage at the node 111 is at Vdd, th node 113 is coupled to the node 111 and to the Vdd signal level. The voltage at the node 113 is decreased as the transistor Q7 discharges the signal at node 113 to ground, thereby passing through the trip voltage threshold for the input to the inverter 130. The output of the inverter 130, responsive to the input, is forced to a high signal level, which is present at the node 112. As the output at the node 112 goes to a high signal level, the signal node 112 is coupled to the node 114, causing the voltage at the node 114 to be at a high signal level. The high level signal at the node 114 causes the inverter 110 to output a low level voltage at its output at node 111. Since the voltage at node 112 is at a high signal level, the clamp transistor Q5 is enabled, thereby shunt connecting the signal at the node 113 to the node 111, preventing the voltage at the node 113 from going below the ground level Vss. The clamping transistor Q5 of the clamping element 121 essentially shorts out the capacitor C1, and in a similar manner, the transistor Q6 of the second clamping element 141 essentially shorts out the capacitor C2, during the high level to low level transition at the nodes 111 and 112, respectively.

Figure 7:
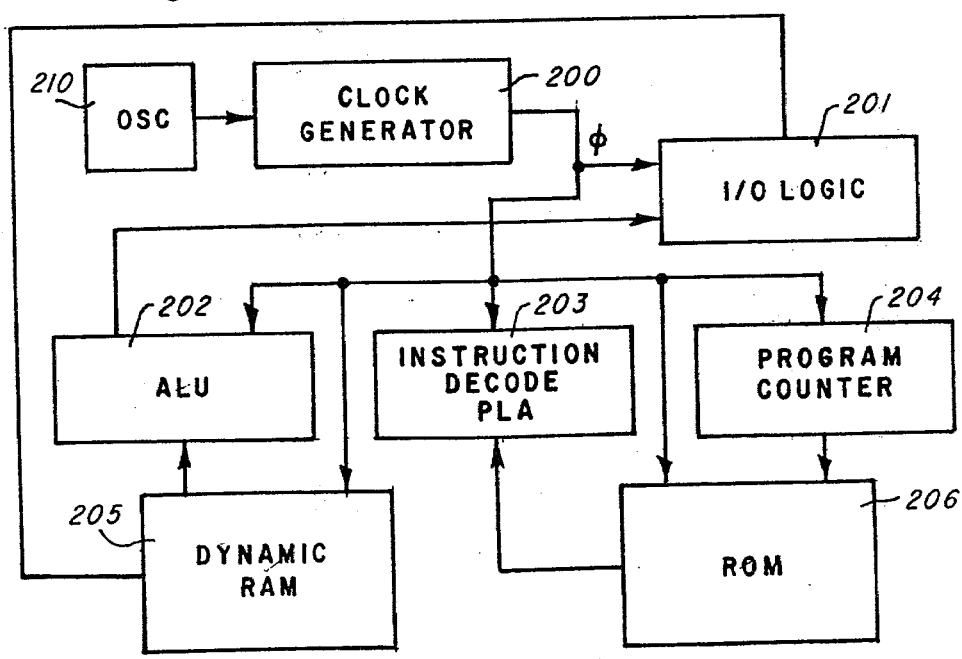
FIG. 7 is a block diagram of an oscillator system embodying the present invention in the integrated circuit of the calculator system of FIGS. 1 and 2.

Referring to FIG. 7, a preferred embodiment of the oscillator system of the present invention is shown in a calculator system as shown in FIGS. 1 and 2, and is implemented in the form of an integrated circuit such as the chip 20 of FIGS. 1 and 2. An oscillator means 210, comprising a preferred embodiment of the present invention, is connected to a clock generator 200. The clock generator 200 outputs clock voltage timing signals to the remainder of the system of FIG. 7. The outputs of the clock generator 200 are connected to input/output logic 201, processor means 202, instruction decode PLA means 203, program counter means 204, RAM means 205, and ROM means 206. The utilization of the oscillator means 210 in the system of FIG. 7 is independent of the interconnection scheme of the blocks 201–206 of FIG. 7, and other block functions and interconnection schemes may be utilized with the oscillator 210. In a calculator with dynamic logic, the logic is clocked throughout the entire system, and therefore multiple clocks of differing phases are necessary to manipulate the data throughout the system during the proper time periods of an instruction cycle. In order to generate the multiple clocks, the oscillator means 10 must provide a stable master frequency source which is divided down by the clock generator 200. As the system powers up, the oscillator means 10 must first stabilize before the remainder of the system of FIG. 7 becomes operational.

The output frequency of the oscillator of the present invention, for example as shown in FIG. 5, decreases monotonically with supply voltage ($V_{dd}$), which is advantageous in that the remainder of the MOS calculator circuitry exhibits decreasing operational frequency proportional to the supply voltage ($V_{DD}$). This results in the total integrated circuit functioning compatibly over a wider operating voltage range than would be possible if the oscillator did not exhibit frequency of operation monotonically decreasing with supply voltage.

Although the invention has been described with reference to specific embodiments, the description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An oscillator for providing first and second, substantially complementary output signals, the oscillator comprising:
   a first inverter providing the first output signal a first predetermined time period after receiving a first inverter drive signal;
   a first delay network connected to the first inverter, the first delay network receiving the first output signal and providing a second inverter drive signal a predetermined second time period after receiving the first output signal;
   first clamping means connected to the first inverter and to the first delay network, and first clamping means receiving the second output signal and clamping the second inverter drive signal to the level of the first output signal in response to receiving the second output signal;
   a second inverter connected to the first delay network and to the first clamping means, the second inverter receiving the second inverter drive signal and providing the second output signal a predetermined third time period after receiving the second inverter drive signal;
   a second delay network connected to the second inverter and to the first inverter, the second delay network receiving the second output signal and providing the first inverter drive signal a predetermined fourth time period after receiving the second output signal; and
   second clamping means connected to the first inverter, to the second inverter and to the second delay network; the second clamping means receiving the first output signal and clamping the first inverter drive signal to the level of the second output signal in response to receiving the first output signal.

2. The oscillator as recited in claim 1 wherein each of said first and second delay networks is comprised of a capacitor and an active resistive element.

3. The oscillator as recited in claim 2 wherein;
   said first clamping means is comprised of a transistor connected in parallel with said first delay network capacitor; and
   said second clamping means is comprised of a transistor connected in parallel with said second delay network capacitor.

4. The oscillator system as recited in claim 2 wherein the oscillator is additionally comprised of:
   control means for selective connecting a control input to a first supply voltage level or to a second supply voltage level; and
   the active resistive element of each of the first and second delay networks is comprised of a metal oxide semiconductor transistor having a gate, the gate of one of the first and second delay network active resistive elements being connected to the first supply voltage level so as to bias On that active resistive element, and the gate of the other delay network active resistive element being connected to the control input and responsive thereto so as to bias On said other delay network active resistive element when the voltage at the control input is at the first supply voltage level, thereby enabling the system to oscillate, and so as to bias Off said other delay network active resistive element when the voltage at the control input is at a second supply voltage level thereby inhibiting oscillation of the system.

5. A portable, hand held, battery operable calculator having a keyboard, a display, and an integrated circuit with an oscillator for providing clock pulses for controlling operation performed by said integrated circuit and display, said oscillator for providing first and second output signals, said oscillator comprising:
   a first inverter providing the first output signal a first predetermined time period after receiving a first inverter drive signal;
   a first delay network connected to the first inverter, the first delay network receiving the first output signal and providing a second inverter drive signal a predetermined second time period after receiving the first output signal;
   first clamping means connected to the first inverter and to the first delay network, the first clamping means receiving the second output signal and clamping the second inverter drive signal to the level of the first output signal in response to receiving the second output signal;

a second inverter connected to the first delay network and to the first clamping means, the second inverter receiving the second inverter drive signal and providing the second output signal a predetermined third time period after receiving the second inverter drive signal;

a second delay network connected to the second inverter and to the first inverter, the second delay network receiving the second output signal and providing the first inverter drive signal a predetermined fourth time period after receiving the second output signal; and, second clamping means, connected to the first inverter, to the second inverter and to the second delay network, the second clamping means receiving the first output signal and clamping the first inverter drive signal to the level of the second output signal in response to receiving the first output signal.

6. The calculator as in claim 5 wherein;

each of said first and second delay networks is comprised of a capacitor and an active resistive element.

7. The calculator as in claim 6 wherein said first clamping means is comprised of a transistor connected in parallel with said first delay network capacitor; and said second clamping means is comprised of a transistor connected in parallel with said second delay network capacitor.

8. The calculator as in claim 6 wherein the oscillator is additionally comprised of:

control means for selective connecting a control input to a first supply voltage level or to a second supply voltage level; and the active resistive element of each of the first and second delay networks is comprised of a metal oxide semiconductor transistor having a gate, the gate of either the first or second network active element connecting to a first supply voltage so as to bias On that element, and the gate of the other network active element connecting to a control input and responsive thereto so a to bias On said other active element when the voltage at the control input is at the first supply voltage level, thereby enabling the system to oscillate, and so as to bias Off said other network active element when the voltage at the control input is at a second supply voltage level thereby inhibiting oscillation of the system.

* * * * *